(12) United States Patent
Dekosky et al.

(10) Patent No.: US 10,587,029 B2
(45) Date of Patent: Mar. 10, 2020

(54) MULTI-LAYER SUBSTRATE WITH INTEGRATED RESONATOR

(71) Applicant: Qorvo US, Inc., Greensboro, NC (US)

(72) Inventors: Jeffrey Dekosky, Winter Garden, FL (US); Deepukumar M. Nair, Lake Mary, FL (US); Scott M. Knapp, Orlando, FL (US); Tarak A. Railkar, Plano, TX (US); Lawrence A. Carastro, Windermere, FL (US); Timothy G. Kraus, Brooksville, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/025,240

(22) Filed: Jul. 2, 2018

(65) Prior Publication Data
US 2019/0074571 A1 Mar. 7, 2019

Related U.S. Application Data

(60) Provisional application No. 62/555,150, filed on Sep. 7, 2017.

(51) Int. Cl.
*H01P 7/10* (2006.01)
*H01P 1/30* (2006.01)
*H03H 1/00* (2006.01)
*H01P 1/203* (2006.01)

(52) U.S. Cl.
CPC .......... *H01P 7/105* (2013.01); *H01P 1/20309* (2013.01); *H01P 1/30* (2013.01); *H01P 7/10* (2013.01); *H03H 1/00* (2013.01); *H03H 2001/0057* (2013.01); *H03H 2001/0085* (2013.01)

(58) Field of Classification Search
CPC ........ H01P 7/105; H01P 7/10; H01P 1/20309; H01P 1/30; H03H 2001/0085
USPC ........................................... 333/219.1, 219.2
See application file for complete search history.

(56) References Cited

U.S. PATENT DOCUMENTS

2016/0261016 A1* 9/2016 Pu .......................... H01P 1/2084
2017/0365902 A1* 12/2017 Ashida .................. H01P 1/2002

* cited by examiner

*Primary Examiner* — Rakesh B Patel
(74) *Attorney, Agent, or Firm* — Withrow & Terranova, P.L.L.C.

(57) ABSTRACT

The present disclosure relates to a substrate that includes a substrate body and a resonator integrated within the substrate body. The resonator includes a resonator body, a top resonator plate, and a bottom resonator plate. The resonator body extends through the substrate body from a top surface to a bottom surface of the substrate body, and is formed of at least one of a dielectric material and a magnetic material. The top resonator plate is coupled to a top side of the resonator body and resides over the top surface of the substrate body, and the bottom resonator plate is coupled to a bottom side of the resonator body and resides over the bottom surface of the substrate body. The top resonator plate and the bottom resonator plate are electrically conductive.

22 Claims, 7 Drawing Sheets

MULTI-LAYER SUBSTRATE WITH INTEGRATED RESONATOR

RELATED APPLICATIONS

This application claims the benefit of provisional patent application Ser. No. 62/555,150, filed Sep. 7, 2017, the disclosure of which is hereby incorporated herein by reference in its entirety.

FIELD OF THE DISCLOSURE

The present disclosure relates to a substrate with at least one functional electronic component, and more particularly to a multi-layer substrate with at least one integrated resonator.

BACKGROUND

With the popularity of portable communication devices, such as smart phones and so forth, numerous fabrication technologies are geared towards electronics miniaturization and densification. Embedding techniques are widely used in substrates of the communication devices. For instance, embedding a high thermal conductor component in the substrate will provide a low resistance heat path to thermal ground. In addition, the embedding techniques may also provide an attractive interconnect solution without wire bonding for improved electrical performance, and offer the potential to reduce manufacturing cost for complex products.

In communication devices, radio frequency (RF) filters are key components to determine electrical performances. Typical filter solutions for RF and microwave frequencies include discrete filters, coupled line filters, cavity filters, and acoustic filters. Due to their small size, high Q values, and very low insertion losses at microwave frequencies, the acoustic filters (including Bulk Acoustic Wave (BAW) filter and Surface Acoustic Wave (SAW) filter) are highly desired in modern communication applications. Conventional dielectric loaded resonator-based filters may achieve high Q factors, but require very careful manufacturing processes with exacting mechanical alignment requirements. Sometimes, the resonators in the conventional dielectric loaded filters tend to lose mechanical alignment in field service with their properties shifting with time and environmental conditions, thereby severely impacting system level performance. In addition, the dielectric resonators may need to be manually tuned after fabrication, which significantly increases production cycle time and cost. In the case of acoustic filters, though there is no need for mechanical alignment, each frequency band of the acoustic filter may require a specific resonator structure, which significantly limits the scalability of such filters.

Accordingly, there remains a need for improved substrate and resonator designs, which utilize the advantages of embedding techniques in substrates and solve the alignment and scalability issues. Further, there is also a need to keep the final product cost effective without increasing fabrication complexity.

SUMMARY

The present disclosure relates to a substrate that includes a substrate body and a resonator integrated within the substrate body. The substrate body has a top surface and a bottom surface opposite the top surface of the substrate body. The resonator includes a resonator body, a top resonator plate, and a bottom resonator plate. The resonator body extends through the substrate body from the top surface to the bottom surface of the substrate body, and is formed of at least one of a dielectric material and a magnetic material. The top resonator plate is coupled to a top side of the resonator body and resides over the top surface of the substrate body, and the bottom resonator plate is coupled to a bottom side of the resonator body and resides over the bottom surface of the substrate body. The top resonator plate and the bottom resonator plate are electrically conductive.

In one embodiment of the substrate, the dielectric material has a dielectric constant greater than 2.

In one embodiment of the substrate, the magnetic material has a relative permeability greater than 1.

According to another embodiment, the substrate further includes at least one substrate via structure extending through the substrate body from the top surface of the substrate body to the bottom surface of the substrate body. Herein, the at least one substrate via structure is electrically connected to the resonator.

According to another embodiment, the substrate further includes a heat spreader extending through the substrate body from the top surface of the substrate body to the bottom surface of the substrate body. Herein, the heat spreader is electrically isolated from the at least one substrate via structure.

In one embodiment of the substrate, the heat spreader is formed of copper or Aluminum Nitride.

In one embodiment of the substrate, the substrate body includes a number of dielectric layers.

In one embodiment of the substrate, each dielectric layer is formed from organic materials or ceramic materials.

In one embodiment of the substrate, the resonator further includes a number of resonator via structures, which are electrically connecting the top resonator plate and the bottom resonator plate.

In one embodiment of the substrate, the resonator body is a cuboid.

In one embodiment of the substrate, the resonator body is a cylinder.

In one embodiment of the substrate, the resonator body is formed of one of a group consisting of Alumina, Aluminum Nitride, and Barium Strontium Titanate.

In one embodiment of the substrate, the resonator further includes an input terminal and an output terminal, which are coupled to the top resonator plate and residing over the top surface of the substrate body.

In one embodiment of the substrate, the resonator body includes a number of resonator layers. Each resonator layer is configured to provide a different resonant frequency.

In one embodiment of the substrate, each resonator layer is a cuboid.

In one embodiment of the substrate, each resonator layer is a cylinder.

In one embodiment of the substrate, each resonator layer has a different size. Herein, each resonator layer is formed of a same dielectric material or a same magnetic material.

In one embodiment of the substrate, each resonator layer has a same height and a different plane size.

In one embodiment of the substrate, each resonator layer has a same plane size and a different height.

In one embodiment of the substrate, the resonator body has a trapezoidal configuration in a vertical direction.

In one embodiment of the substrate, the resonator body has a double-trapezoidal configuration in a vertical direction.

In one embodiment of the substrate, each resonator layer is formed of a different dielectric material or a different magnetic material.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
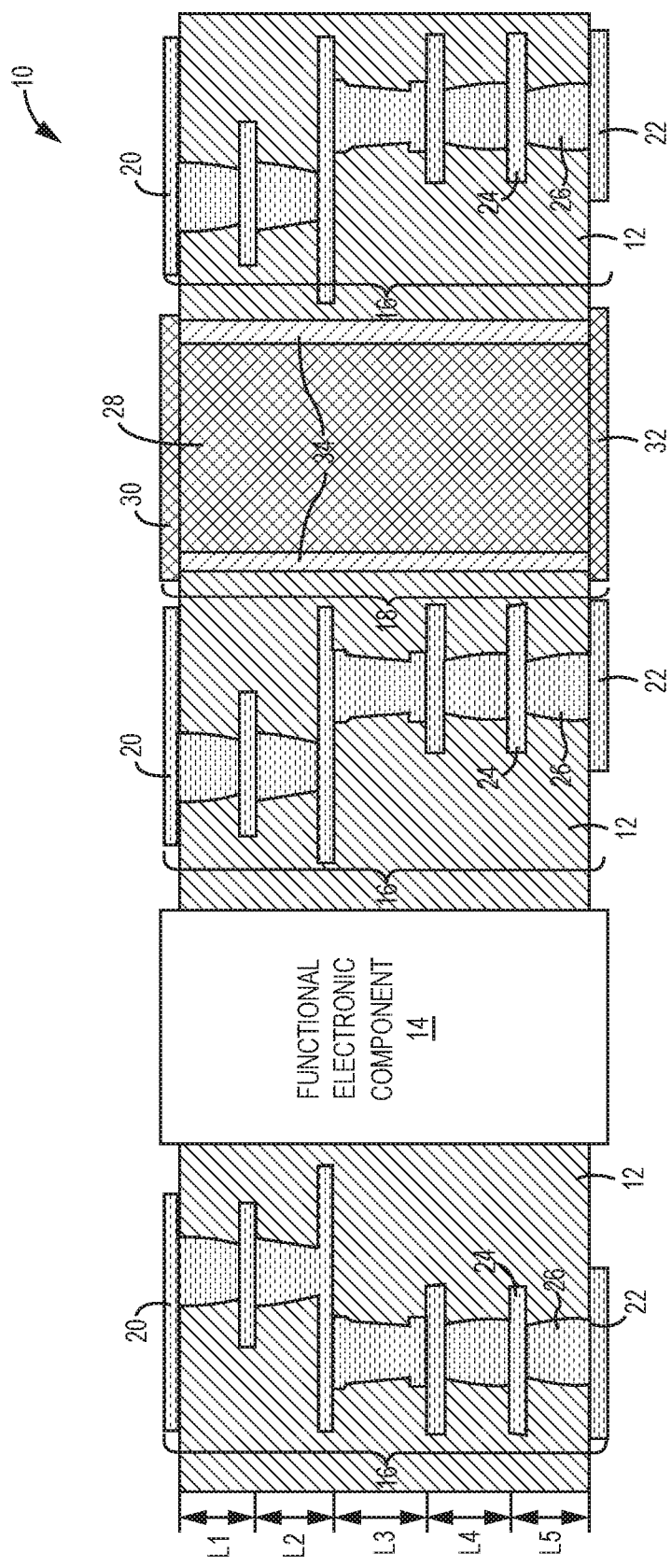
FIG. 1 shows an exemplary multi-layer substrate according to one embodiment of the present disclosure.

It will be understood that for clear illustrations, FIGS. 1-5B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a substrate with at least one functional electronic component. FIG. 1 provides an exemplary substrate 10 according to one embodiment of the present disclosure. For the purpose of this illustration, the substrate 10 includes a substrate body 12, a functional electronic component 14, three substrate via structures 16, and a thermal conducting component 18. In different applications, the substrate 10 may include multiple functional electronic components 14, fewer or more substrate via structures 16, and no or multiple thermal conducting components 18.

In detail, the substrate body 12 has a top surface and a bottom surface opposite the top surface of the substrate body 12 and includes multiple dielectric layers and multiple routing layers. For the purpose of this illustration, the substrate body 12 includes five dielectric layers L1-L5 and six routing layers, which are in-between the dielectric layers, at the top of the substrate body 12, and at the bottom of the substrate body 12 (not shown). Generally, the number of the routing layers is one more than the number of the dielectric layers. Each dielectric layer may have a same or different height, and may be formed from organic materials (such as flame retardant 4, Megtron-6, Rogers RO-6035, etc.) or ceramic materials (such as LTCC, HTCC, Alumina, etc). The substrate body 12 may have two or more dielectric/routing layers.

The substrate via structures 16 extend through the substrate body 12 from the top surface to the bottom surface of the substrate body 12. Each substrate via structure 16 may include a top via pad 20 that resides over the top surface of the substrate body 12, a bottom via pad 22 that resides over the bottom surface of the substrate body 12, multiple inner via layers 24 integrated in the substrate body 12, and a number of via connections 26 coupling the top via pad 20, the inner via layers 24, and the bottom via pad 22 (only one inner via layer and one via connection in each substrate via structure are labeled with reference numbers for clarity). In some applications, the substrate via structure 16 may not include the inner via layer 24, such that the via connections 26 are directly connecting the top via pad 20 and the bottom via pad 22. The top via pad 20, the bottom via pad 22, and the inner via layers 24 may be formed of metallic materials (such as copper), and the via connections 26 may be formed as via holes, within which electrically conductive materials (such as copper) are filled or plated. The via connections 26 may also be realized by plating inner walls of the via holes with an electrically conductive material (such as copper), then filling the via holes with non-conductive materials such as epoxy resin.

The thermal conducting component 18 does not propagate any radio frequency (RF) signal. In some applications, the thermal conducting component 18 may be electrically grounded. The thermal conducting component 18 may include a heat spreader 28, a top heat plate 30, and a bottom heat plate 32. The heat spreader 28 extends through the substrate body 12 from the top surface to the bottom surface of the substrate body 12. The heat spreader 28 may be coupled to the substrate body 12 via adhesive 34. In different applications, the adhesive 34 may be absent and the heat spreader 28 may be directly coupled to the substrate body 12. Herein, the heat spreader 28 is a rectangular block, but other shapes may also apply. A top side of the heat spreader 28 and a bottom side of the heat spreader 28, which is opposite the top side of the heat spreader 28, may have the same or different size/shape. The top heat plate 30 is coupled to the top side of the heat spreader 28 and resides over the top surface of the substrate body 12. The bottom heat plate 32 is coupled to the bottom side of the heat spreader 28 and resides over the bottom surface of the substrate body 12. The heat spreader 28, the top heat plate 30, and the bottom heat plate 32 may be formed of metallic or ceramic materials, such as copper and/or Aluminum Nitride. In some applications, the substrate 10 may not include the thermal conducting component 18, and in some applications, the substrate 10 may include other components, such as embedded capacitors and/or inductors.

The functional electronic component 14 is integrated in the substrate body 12 and there is no alignment requirement for the functional electronic component 14 once it is embedded in the substrate body 12. The functional electronic component 14 is configured to propagate signals to other active or passive functional components integrated in the substrate body 12 (not shown) or external active or passive components (not shown). The functional electronic component 14 may be electrically connected to at least one of the substrate via structures 16 (not shown), while the thermal conducting component 18 may be electrically isolated from the substrate via structures 16. A top portion of the functional electronic component 14, the top via pad 20 of each substrate via structure 16, and the top heat plate 30 of the thermal conducting component 18 are coplanar. A bottom portion of the functional electronic component 14, the bottom via pad 22 of each substrate via structure 16, and the bottom heat plate 32 of the thermal conducting component 18 are coplanar. Herein, the functional electronic component 14 may be resonators, a filter formed by resonators, or any other passive network formed by resonators.

Figure 2A:
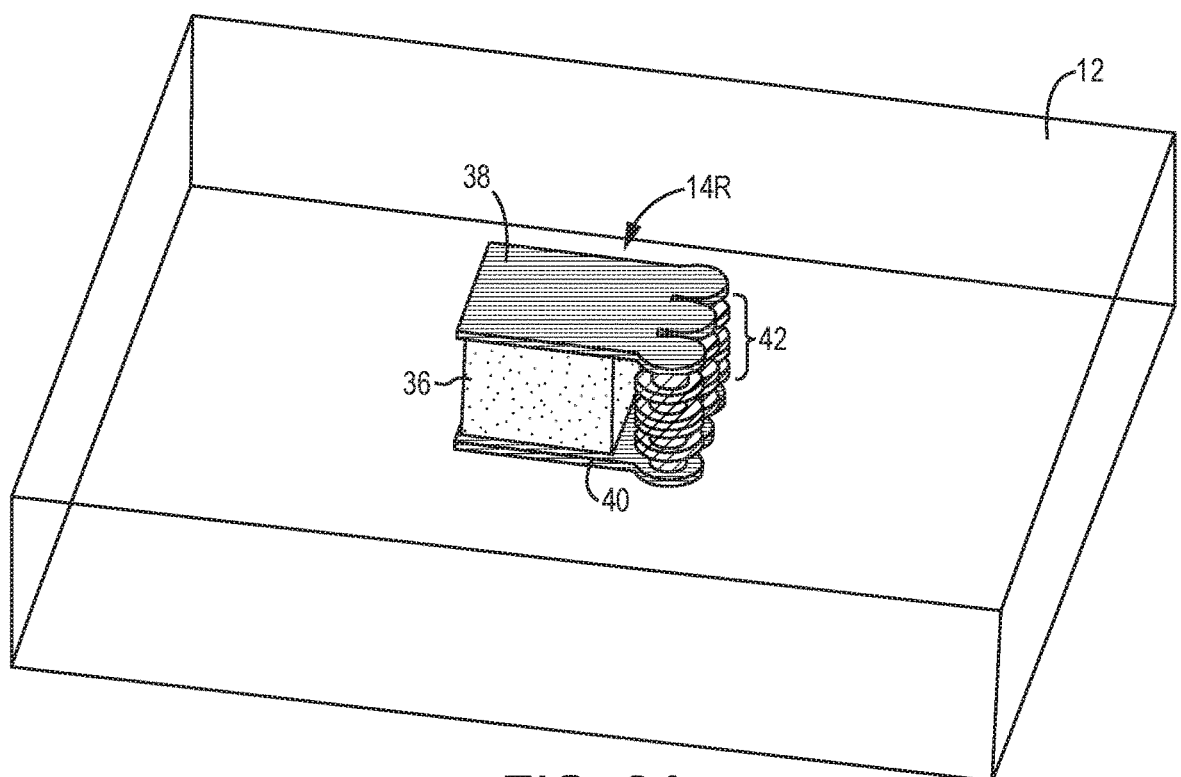
FIGS. 2A-2B show an exemplary resonator integrated in the multi-layer substrate shown in FIG. 1.
Figure 2B:
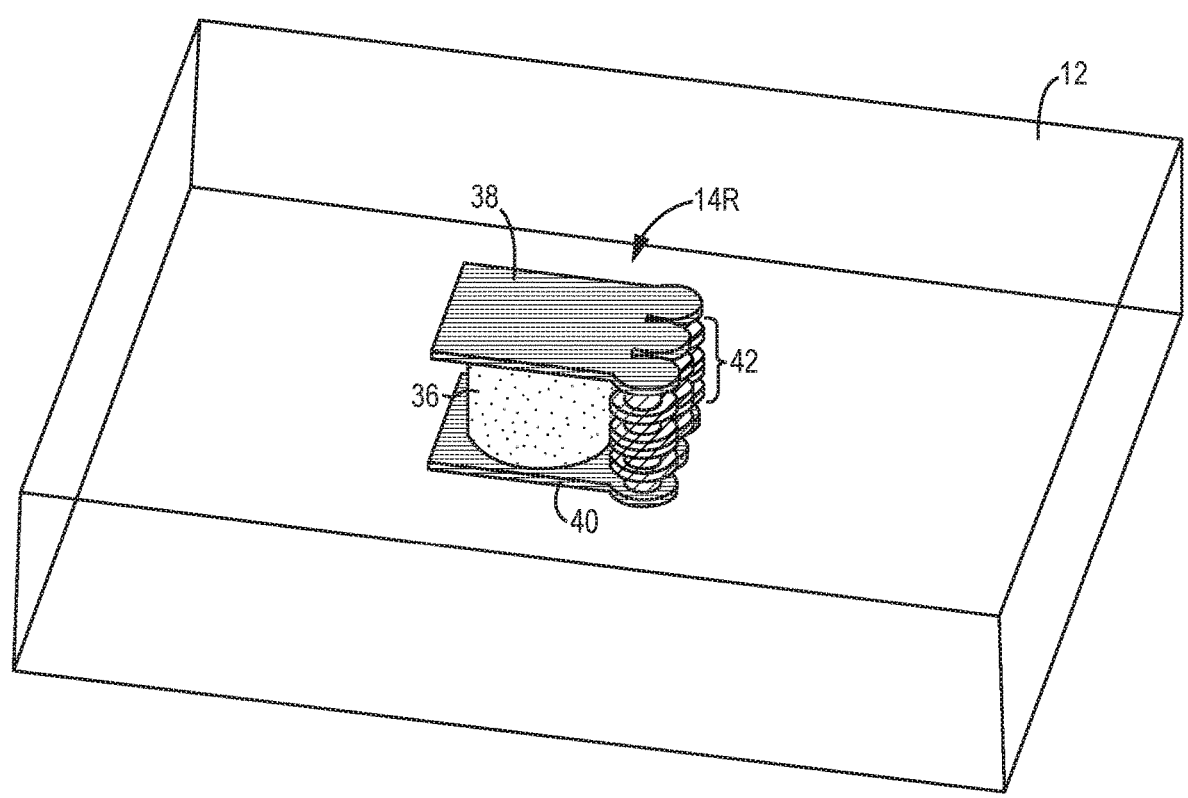

FIGS. 2A-2B show an exemplary functional electronic component: a resonator 14R, which may be integrated in the substrate 10 shown in FIG. 1. In this embodiment, the resonator 14R includes a resonator body 36, a top resonator plate 38, a bottom resonator plate 40, and a number of resonator via structures 42. The resonator body 36 extends through the substrate body 12 from the top surface to the bottom surface of the substrate body 12. For different applications and design requirements, the resonator body 36 may be a cuboid (FIG. 2A), a cylinder (FIG. 2B), or other suitable shapes. The top resonator plate 38 is coupled to a top side of the resonator body 36 and resides over the top surface of the substrate body 12. As such, the top resonator plate 38 of the resonator 14R, the top via pad 20 of the substrate via structure 16, and the top heat plate 30 of the thermal conducting component 18 are coplanar. The bottom resonator plate 40 is coupled to a bottom side of the resonator body 36 and resides over the bottom surface of the substrate body 12. As such, the bottom resonator plate 40 of the resonator 14R, the bottom via pad 22 of the substrate via structure 16, and the bottom heat plate 32 of the thermal conducting component 18 are coplanar. The resonator body 36 is confined within the top resonator plate 38 and the bottom resonator plate 40. The resonator body 36 may be formed of at least one of a dielectric material and a magnetic material. The dielectric material has a dielectric constant greater than 2, or between 10 and 3000, such as Alumina, Aluminum Nitride and Barium Strontium Titanate. The magnetic material has a relative permeability greater than 1 or greater than 10, such as ferrite or ferromagnetic alloys of very high permeability. The top resonator plate 38 and the bottom resonator plate 40 are electrically conductive and may be formed of copper. The resonator via structures 42 may be formed of copper, and are electrically connecting the top resonator plate 38 and the bottom resonator plate 40. It is clear to those in the art that the resonator 14R is a one port resonator, which may be used to form a filter configuration such as Chebyshev, Butterworth, Elliptical or any form of ladder filters.

Figure 3A:
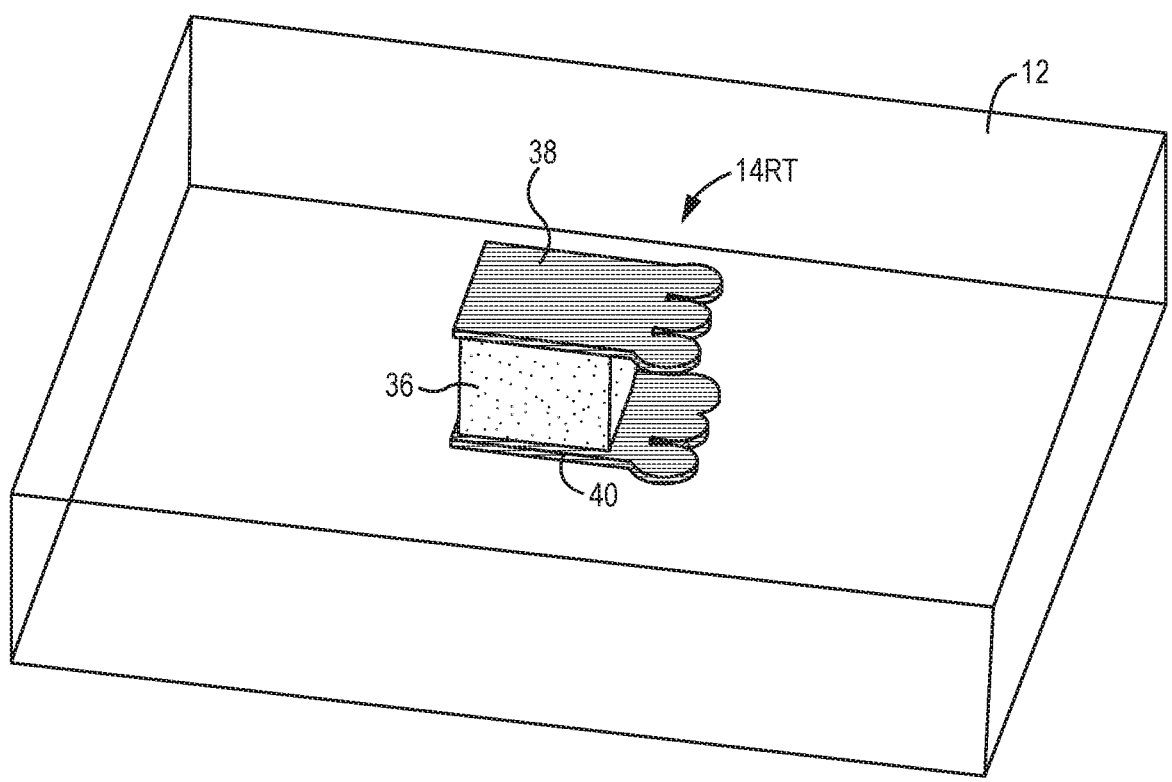
FIGS. 3A-3C show an alternative resonator integrated in the multi-layer substrate shown in FIG. 1.
Figure 3B:
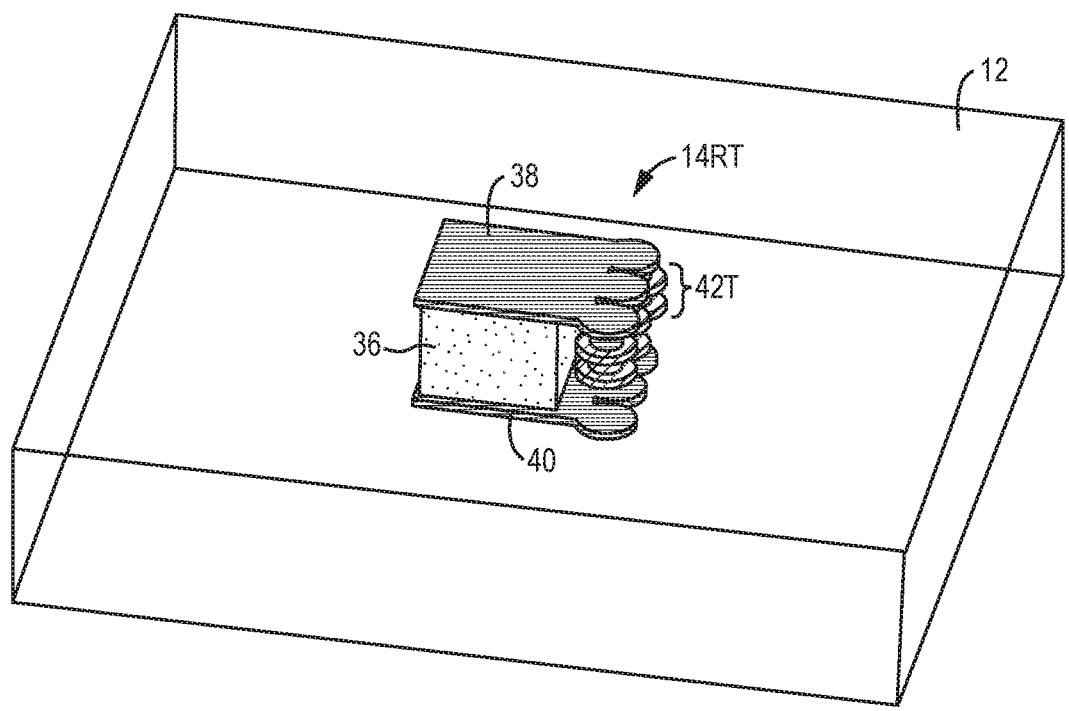
Figure 3C:
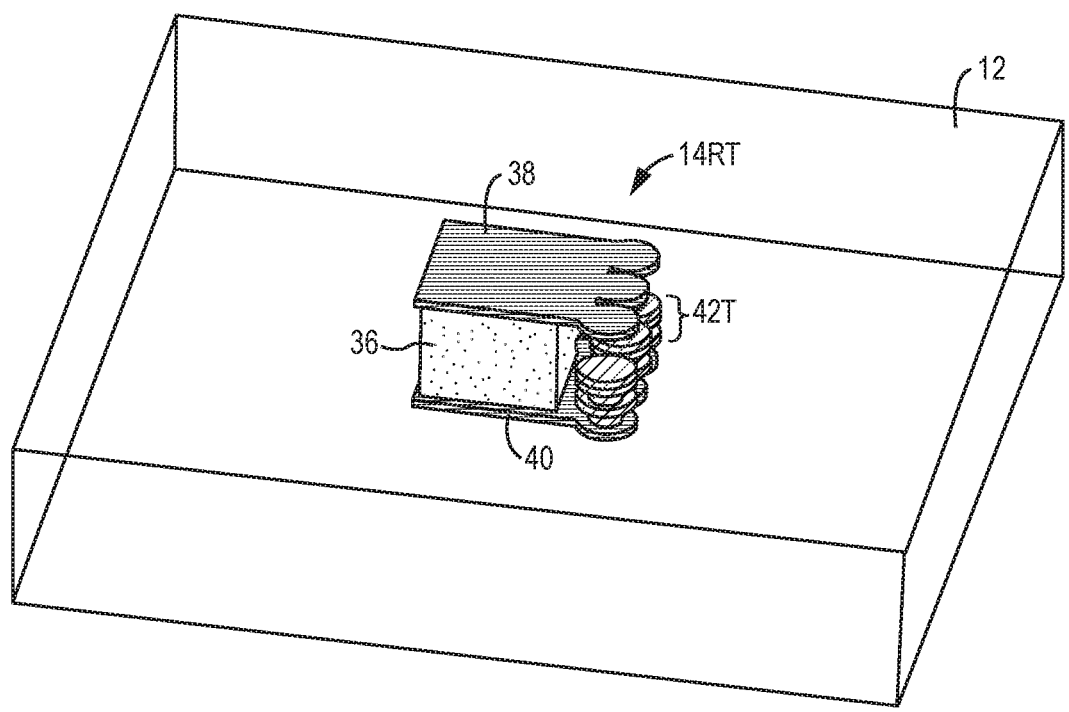

In some applications, the substrate 10 may include a two-port resonator 14RT with an input port and an output port instead of the one port resonator 14R. As shown in FIG. 3A, the two-port resonator 14RT includes the resonator body 36, the top resonator plate 38 (function as an input port), the bottom resonator plate 40 (function as an output port), but no resonator via structure 42. Herein, the top resonator plate 38 and the bottom resonator plate 40 are isolated from each other by the resonator body 36. In FIG. 3B, the two-port resonator 14RT includes the resonator body 36, the top resonator plate 38, the bottom resonator plate 40, and a number of resonator via structures 42T. The resonator via structures 42T are coupled to the top resonator plate 38, but not coupled to the bottom resonator plate 40, such that the top resonator plate 38 and the bottom resonator plate 40 keep isolated from each other. Similarly, in FIG. 3C, the resonator via structures 42T are coupled to the bottom resonator plate 40, but not coupled to the top resonator plate 38. As such, the top resonator plate 38 is isolated from the bottom resonator plate 40. The two-port resonator 14RT may be used to form a ladder filter or any other classical filter.

Figure 4:
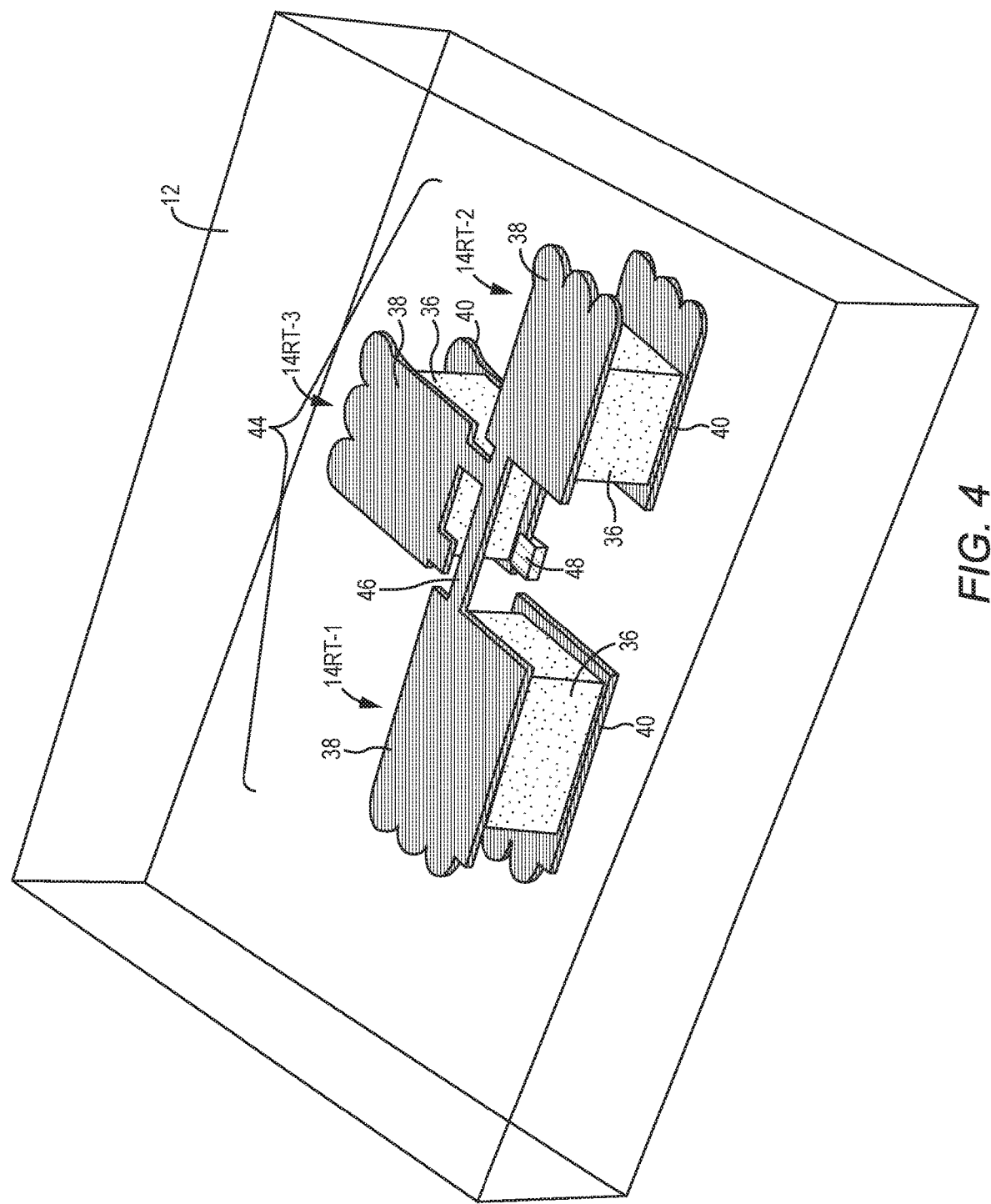
FIG. 4 shows an exemplary filter formed by the resonators shown in FIG. 3A.

FIG. 4 shows an exemplary ladder filter 44 formed by the two-port resonators 14RT shown in FIG. 3A. For the purpose of this illustration, the ladder filter 44 includes a first two-port resonator 14RT-1, a second two-port resonator 14RT-2, and a third two-port resonator 14RT-3. Each of the first, second and third two-port resonators 14RT-1, 14RT-2, and 14RT-3 includes the resonator body 36, the top resonator plate 38, and the bottom resonator plate 40. The top resonator plates 38 of the first, second and third two-port resonators 14RT-1, 14RT-2 and 14RT-3 are coupled together through substrate top traces 46. The bottom resonator plate 40 of the first two-port resonator 14RT-1 is configured to receive input signals, the bottom resonator plate 40 of the second two-port resonator 14RT-2 is configured to transmit output signals, and the bottom resonator plate 40 of the third two-port resonator 14RT-3 is coupled to ground via a system ground connector 48.

Figure 5A:
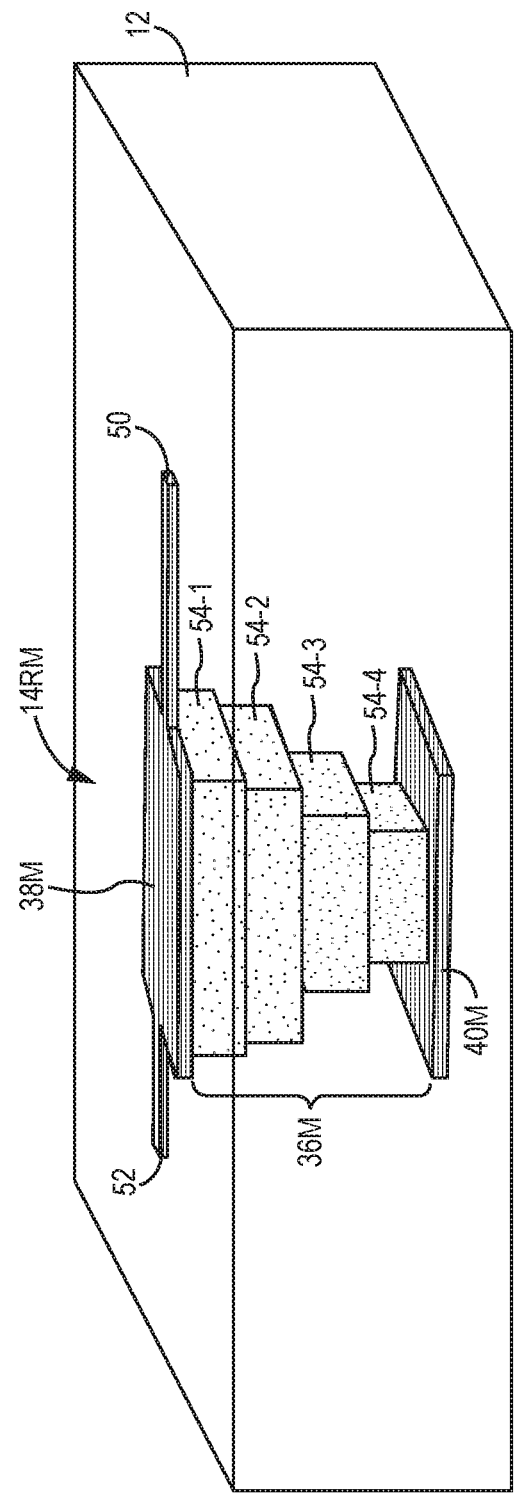
FIGS. 5A-5B show an exemplary multi-mode resonator integrated in the multi-layer substrate shown in FIG. 1.

In another embodiment, the functional electronic component integrated in the substrate 10 may include a multi-mode resonator 14RM as shown in FIG. 5A. The multi-mode resonator 14RM includes a multi-layer resonator body 36M, a top resonator plate 38M with an input terminal 50 and an output terminal 52, and a bottom resonator plate 40M. Herein, the multi-layer resonator body 36M includes four body layers 54 and each body layer 54 is a cuboid with a same height and a different plane size. The plane sizes of the body layers 54 decrease from top to bottom, such that the multi-layer resonator body 36M has a trapezoidal configuration in a vertical direction. The multi-layer resonator body 36M extends through the substrate body 12 from the top surface to the bottom surface of the substrate body 12. A first body layer 54-1 is at the top portion of the multi-layer resonator body 36M and coupled to the top resonator plate 38M. A second body layer 54-2 is underlying the first body layer 54-1 and has a smaller plane size than the first body layer 54-1. A third body layer 52-3 is underlying the second body layer 54-2 and has a smaller plane size than the second body layer 54-2. A fourth body layer 54-4 is underlying the third body layer 54-3, at the bottom portion of the multi-layer resonator body 36M, coupled to the bottom resonator plate 40M, and has a smaller plane size than the third body layer 54-3. The first, second, third and fourth body layers 54-1, 54-2, 54-3, and 54-4 are confined within the top resonator plate 38M and the bottom resonator plate 40.

The top resonator plate 38M resides over the top surface of the substrate body 12, and the bottom resonator plate 40M resides over the bottom surface of the substrate body 12. The input terminal 50 of the top resonator plate 38M is configured to receive input signals, the output terminal 52 of the top resonator plate 38M is configured to transmit output signals, and the input terminal 50 and the output terminal 52 reside on opposite sides of the top resonator plate 38M. The top resonator plate 38 and the bottom resonator plate 40M are isolated from each other by the multi-layer resonator body 36. Each body layer 54 is formed of at least one of a dielectric material and a magnetic material. The dielectric material has a dielectric constant greater than 2, or between 10 and 3000, such as Alumina, Aluminum Nitride and Barium Strontium Titanate. The magnetic material may have a relative permeability greater than 1 or greater than 10, such as ferrite or ferromagnetic alloys of very high permeability. The top resonator plate 38M with the input terminal 50 and the output terminal 52, and the bottom resonator plate 40M are electrically conductive and may be formed of copper or conductive epoxy.

Notice that the size, shape, and material of each body layer 54 will affect resonant frequencies of the multi-mode resonator 14RM. In FIG. 5A, each body layer 54 is a cuboid with a same height and formed of a same material, however, the different plane size of each body layer 54 leads to different resonant frequencies. Herein, each resonator layer 54 performs as a mini resonator and is configured to provide a different resonant frequency, such that the multi-mode resonator 14RM is configured to provide multiple resonant frequencies simultaneously, from 1 GHz to 100 GHz.

In order to provide multiple resonant frequencies, the resonator layer 54 may have at least one feature (size, shape, material) different from each other. In one embodiment, each body layer 54 may have a same shape and a same size in three dimensions, but is formed of different dielectric materials and/or different magnetic materials (not shown). In one embodiment, each body layer 54 is formed of a same material and has a same plane size, but has a different height (not shown). In one embodiment, each body layer 54 has a same height, but has a different plane size and is formed of a different dielectric material and/or a different magnetic material (not shown). In one embodiment, each body layer 54 has a same plane size, but has a different height and is formed of a different dielectric material and/or a different magnetic material (not shown). In one embodiment, each body layer 54 has a different size in three dimensions and is formed of a different dielectric material and/or a different magnetic material (not shown). In addition, besides cuboid, each body layer 54 may be a cylinder or a cube.

Figure 5B:
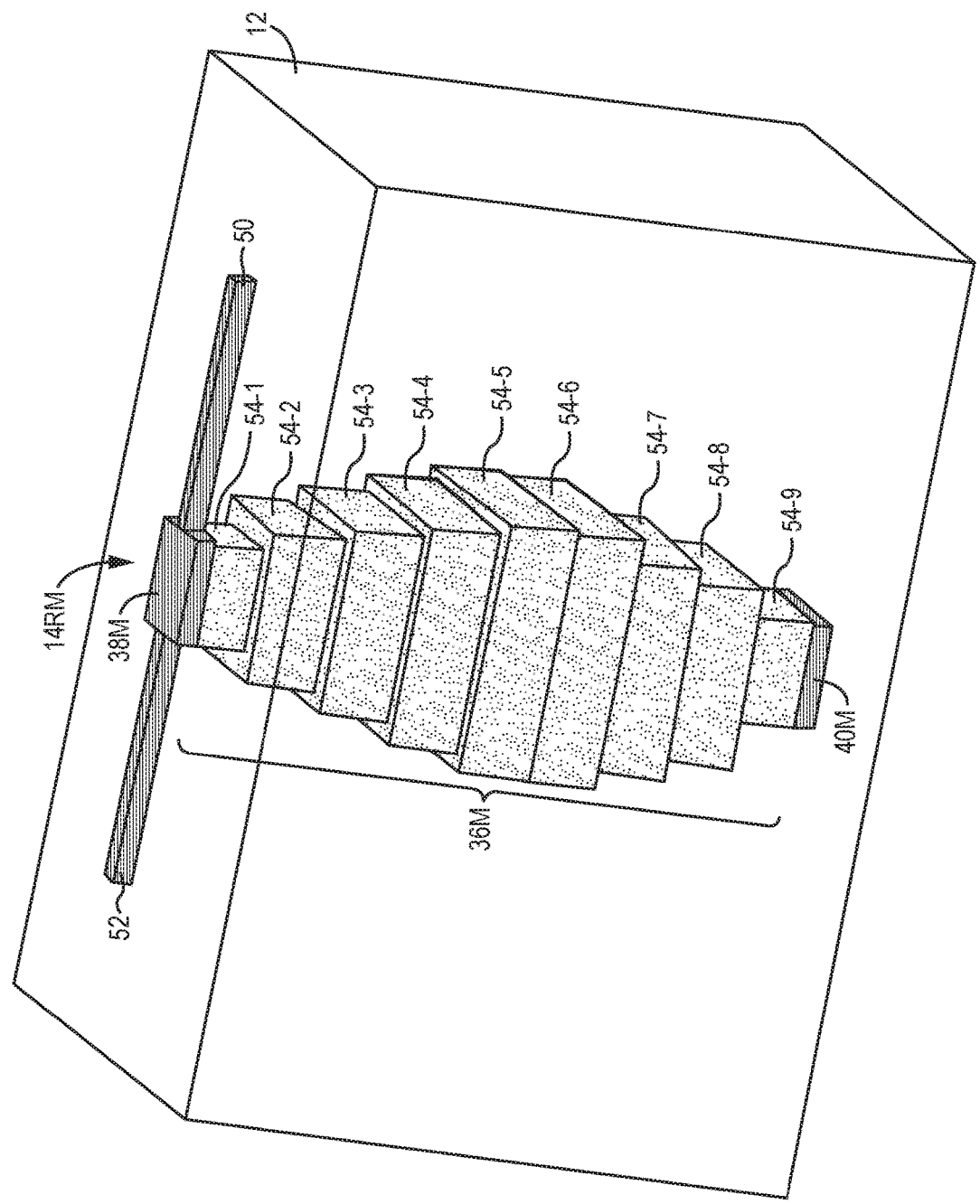

In different applications, the multi-layer resonator body 36M may include fewer or more body layers 54, such that the multi-mode resonator 14RM may be configured to provide fewer or more resonant frequencies. Further, the multi-layer resonator body 36M may have other configurations rather than the trapezoidal configuration. As shown in FIG. 5B, the multi-layer resonator body 36M extends through the substrate body 12 from the top surface to the bottom surface of the substrate body 12, and includes nine body layers 54 and each body layer 55 is a cuboid with a same height. The top resonator plate 38M is isolated from the bottom resonator plate 40M by the multi-layer resonator body 36M.

The plane sizes of the nine body layers 54 increase from top to middle and decrease from middle to bottom, such that the multi-layer resonator body 36M has a double-trapezoidal configuration in the vertical direction. The top resonator plate 38M is coupled to a first body layer 54-1, and resides over the top surface of the substrate body 12. The bottom resonator plate 40M is coupled to a ninth body layer 54-9, and resides over the bottom surface of the substrate body 12. The first body layer 54-1 is confined within the top resonator plate 38M and the ninth body layer 54-9 is confined within the bottom resonator plate 40M. Each body layer 54 may be formed of a same or different dielectric/magnetic material. In other embodiments, the height and or the shape of each body layer 54 may be different. The multi-mode resonator 14RM may be used to form a roofing filter or a band select/band reject filter.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a substrate body having a top surface and a bottom surface opposite the top surface of the substrate body; and
   a resonator integrated in the substrate body; wherein:
      the resonator comprises a resonator body, a top resonator plate, and a bottom resonator plate;
      the resonator body extends through the substrate body from the top surface of the substrate body to the bottom surface of the substrate body;
      the resonator body is formed of at least one magnetic material with a relative permeability greater than 1;
      the top resonator plate is coupled to a top side of the resonator body and resides over the top surface of the substrate body, and the bottom resonator plate is coupled to a bottom side of the resonator body and resides over the bottom surface of the substrate body; and the top resonator plate and the bottom resonator plate are electrically conductive.

2. The apparatus of claim 1 wherein the resonator further comprises a plurality of resonator via structures, wherein each of the plurality of resonator via structures is electrically connected to the top resonator plate and is not electrically connected to the bottom resonator plate.

3. The apparatus of claim 1 wherein the resonator further comprises an input terminal and an output terminal, which are coupled to the top resonator plate and reside over the top surface of the substrate body.

4. The apparatus of claim 1 further comprising at least one substrate via structure extending through the substrate body from the top surface of the substrate body to the bottom surface of the substrate body, wherein the at least one substrate via structure is electrically connected to the resonator.

5. The apparatus of claim 4 further comprising a heat spreader extending through the substrate body from the top surface of the substrate body to the bottom surface of the substrate body, wherein the heat spreader is electrically isolated from the at least one substrate via structure.

6. The apparatus of claim 5 wherein the heat spreader is formed of copper or Aluminum Nitride.

7. The apparatus of claim 1 wherein the substrate body comprises a plurality of dielectric layers.

8. The apparatus of claim 7 wherein each of the plurality of dielectric layers is formed from organic materials or ceramic materials.

9. The apparatus of claim 1 wherein the resonator further comprises a plurality of resonator via structures, wherein each of the plurality of resonator via structures is electrically connected to the top resonator plate and the bottom resonator plate.

10. The apparatus of claim 1 wherein the resonator body is a cuboid.

11. The apparatus of claim 1 wherein the resonator body is a cylinder.

12. An apparatus comprising:
a substrate body having a top surface and a bottom surface opposite the top surface of the substrate body; and
a resonator integrated in the substrate body, wherein:
the resonator comprises a resonator body, a top resonator plate, and a bottom resonator plate;
the resonator body comprises a plurality of resonator layers and extends through the substrate body from the top surface of the substrate body to the bottom surface of the substrate body, wherein each of the plurality of resonator layers is configured to provide a different resonant frequency;
the resonator body is formed of at least one of a dielectric material and a magnetic material;
the top resonator plate is coupled to a top side of the resonator body and resides over the top surface of the substrate body, and the bottom resonator plate is coupled to a bottom side of the resonator body and resides over the bottom surface of the substrate body; and
the top resonator plate and the bottom resonator plate are electrically conductive.

13. The apparatus of claim 12 wherein each of the plurality of resonator layers is formed of a different magnetic material.

14. The apparatus of claim 12 wherein each of the plurality of resonator layers is a cuboid.

15. The apparatus of claim 12 wherein each of the plurality of resonator layers is a cylinder.

16. The apparatus of claim 12 wherein each of the plurality of resonator layers has a different size.

17. The apparatus of claim 16 wherein each of the plurality of resonator layers has a same height and a different plane size.

18. The apparatus of claim 16 wherein each of the plurality of resonator layers has a same plane size and a different height.

19. The apparatus of claim 16 wherein the plurality of resonator layers is formed of a same dielectric or magnetic material.

20. The apparatus of claim 12 wherein the resonator body has a trapezoidal configuration in a vertical direction.

21. The apparatus of claim 12 wherein the resonator body has a double-trapezoidal configuration in a vertical direction.

22. The apparatus of claim 12 wherein each of the plurality of resonator layers is formed of a different dielectric material.

* * * * *